United States Patent
De Cicco et al.

(10) Patent No.: US 11,119,154 B1
(45) Date of Patent: Sep. 14, 2021

(54) BUILT-IN SELF-TEST FOR LIGHT EMITTING DIODES

(71) Applicant: Infineon Technologies AG, Neubiberg (DE)

(72) Inventors: Adolfo De Cicco, Castel d'Azzano (IT); Rosario Chiodo, Selvazzano Dentro (IT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/837,247

(22) Filed: Apr. 1, 2020

(51) Int. Cl.
*G01R 31/3187* (2006.01)
*H05B 45/37* (2020.01)
*H05B 45/50* (2020.01)

(52) U.S. Cl.
CPC ......... *G01R 31/3187* (2013.01); *H05B 45/37* (2020.01); *H05B 45/50* (2020.01)

(58) Field of Classification Search
None
See application file for complete search history.

(56) References Cited

U.S. PATENT DOCUMENTS

| | | | |
|---|---|---|---|
| 6,940,299 B1 | 9/2005 | Lim et al. | |
| 7,049,842 B2 | 5/2006 | Lopezdenava | |
| 9,930,748 B1 | 3/2018 | Scenini | |
| 10,069,399 B1 | 9/2018 | Sambucco et al. | |
| 10,297,190 B2 | 5/2019 | Scenini | |
| 2005/0212459 A1* | 9/2005 | Patel | H05B 45/46 315/291 |
| 2011/0169423 A1* | 7/2011 | Huang | H05B 45/3725 315/297 |
| 2020/0341050 A1* | 10/2020 | Hsiao | G01R 31/2601 |

OTHER PUBLICATIONS

U.S. Appl. No. 16/837,270, filed Apr. 1, 2020, naming inventors De Cicco et al.

* cited by examiner

*Primary Examiner* — Anh Q Tran
(74) *Attorney, Agent, or Firm* — Shumaker & Sieffert, P.A.

(57) ABSTRACT

In some examples, a device includes a built-in self-test for detecting a fault between a first light emitting diode (LED) and a second LED. The device includes a first pair of pads configured to connect to the first LED and a second pair of pads configured to connect to the second LED. The built-in self-test is configured to control a first driver and a second driver to turn on, one-by-one, respective pass switches connected to the first and second pairs of pads. The built-in self-test is configured to then determine the first and second forward voltages across the first and second LEDs. The built-in self-test can determine whether the fault exists between the first and second LEDs based on the forward voltages.

20 Claims, 11 Drawing Sheets

BUILT-IN SELF-TEST FOR LIGHT EMITTING DIODES

TECHNICAL FIELD

This disclosure relates to circuitry for driving light sources such as light emitting devices.

BACKGROUND

Driver circuitry may operate, or drive, one or more light sources, such as light emitting diodes (LEDs). The driver circuitry may control a light intensity output by an LED by varying an average amount of electrical current flowing through the LED and/or by varying an average forward voltage across the LED. For example, the driver circuitry may increase a duty cycle of an electrical current delivered to an LED to increase a light intensity generated by the LED. Similarly, the driver circuit may decrease the duty cycle of the electrical current delivered to an LED to decrease the light intensity generated by the LED. At high switching frequencies, a human eye may perceive a change in the duty cycle of the electrical current as a change in the brightness or intensity of the light generated by the LED.

Modern automotive LED headlights feature multiple and pixelated light sources allowing the control of the individual brightness of the activated pixels or pixel groups. This control enables new light functions such as glare-free high-beam systems, adaptive driving beams, and the projection of symbols. To provide these specific functions, as well as other functions, the headlight may be capable of providing high-resolution light to the entire field of view of the driver.

A headlight can include a matrix array of a large number of LEDs (e.g., more than sixteen thousand LEDs) with a fine pixel-to-pixel pitch or a fine display resolution. The headlight can be constructed using a chip-on-chip concept where a second chip including the LEDs is mounted on a first chip including the light source matrix and drivers using a hybridization process. A first company may manufacture the first chip, while a second company may perform the hybridization process. The manufacture and hybridization processes, especially when performed by different companies, can introduce multiple points of potential failure into the finished product.

SUMMARY

This disclosure describes techniques for testing light emitting diodes (LEDs) using a built-in self-test. A built-in self-test may include processing circuitry configured to test for a fault between first and second LEDs by turning on the first LED and turning off the second LED. The self-test may then be configured to measure the forward voltage across the first LED and the forward voltage across the second LED.

The details of one or more examples are set forth in the accompanying drawings and the description below. Other features, objects, and advantages will be apparent from the description and drawings, and from the claims.

DETAILED DESCRIPTION

This disclosure describes devices, methods, and techniques for testing light sources using a built-in self-test (BIST). The BIST may be configured to detect a fault on a light source, across a pair of pads, and/or in a driver configured to turn the light source. The BIST may be configured to test the driver before and/or after the light source is connected to the driver (e.g., before hybridization). For example, the BIST may be configured to perform a front-end test of the functionality of each current source (e.g., each driver) before a hybridization process.

After the hybridization process is complete, every light emitting diode (LED) may be connected to (e.g., soldered on) a dedicated current source. Therefore, each cathode (for a low-side configuration) or each anode (for a high-side configuration) may no longer be accessible, which can impede testability, field return analysis, and self-diagnosis functionality. For example, a BIST of this disclosure may be configured to check the quality of the assembly and distinguish whether a fault has occurred inside an LED chip, inside the current source driver chip, or across the pads for mounting the LED chip.

Figure 1:
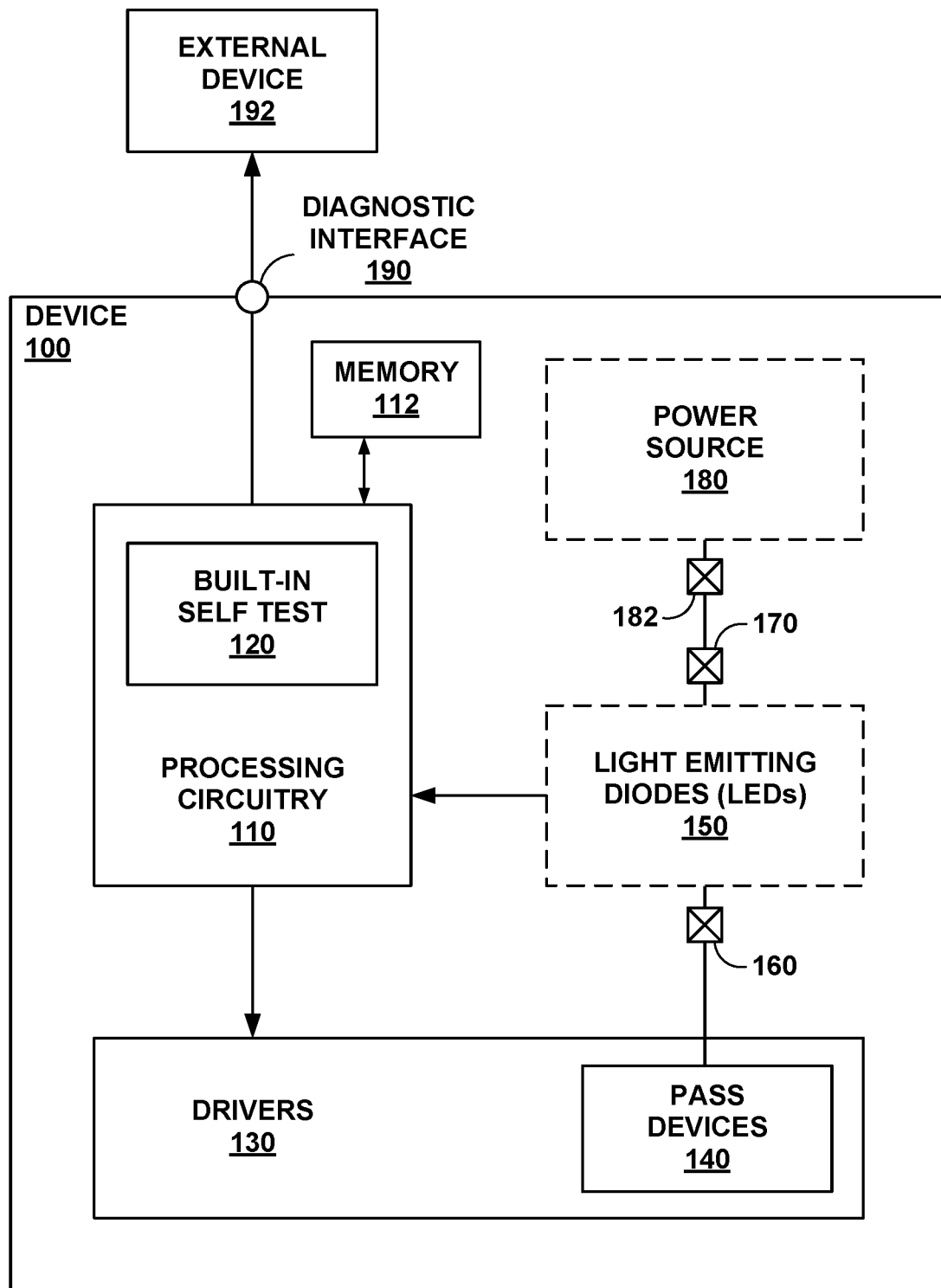
FIG. 1 is a conceptual block diagram of a device including drivers for controlling the operation of light sources, in accordance with the techniques of this disclosure.

FIG. 1 is a conceptual block diagram of a device 100 including drivers 130 for controlling the operation of light sources 150, in accordance with the techniques of this disclosure. In the example of FIG. 1, device 100 includes processing circuitry 110, BIST 120, drivers 130, pass devices 140, and pads 160 and 170. LEDs 150 and power source 180 are optional elements that may be part of device 100 in some examples. Additionally or alternatively, LEDs 150 and/or power source 180 may be external components that can be connected, attached, and/or mounted on device 100. In some examples, device 100 may be a lighting device for a vehicle, a building, and/or any other system that includes a lighting device.

Processing circuitry 110 may be configured to control drivers 130 to operate LEDs 150. For example, processing circuitry 110 may be configured to cause one or more of drivers 130 to turn on one or more respective pass devices 140 to turn on one or more respective LEDs 150. For example, processing circuitry 110 can deliver a low-power control signal to drivers 130, which can generate a higher-power driver signal based on the control signal. Processing circuitry 110 may be configured to also receive a sensed signal indicating a forward voltage across one of LEDs or at a respective pair of pads 160 and 170.

Processing circuitry 110 may include any suitable arrangement of hardware, software, firmware, or any combination thereof, to perform the techniques attributed to processing circuitry 110 herein. Examples of processing circuitry 110 include any one or more microprocessors, digital signal processors (DSPs), application specific integrated circuits (ASICs), field programmable gate arrays (FPGAs), or any other equivalent integrated or discrete logic circuitry, as well as any combinations of such components. When processing circuitry 110 includes software or firmware, processing circuitry 110 further includes any hardware for storing and executing the software or firmware, such as one or more processors or processing units. In examples in which device 100 is mounted on a vehicle, processing circuitry 110 may be implemented by a headlight controller.

In general, a processing unit may include one or more microprocessors, DSPs, ASICs, FPGAs, or any other equivalent integrated or discrete logic circuitry, as well as any combinations of such components. Although not shown in FIG. 1, processing circuitry 110 may include a memory configured to store data. The memory may include any volatile or non-volatile media, such as a random access memory (RAM), read only memory (ROM), non-volatile RAM (NVRAM), electrically erasable programmable ROM (EEPROM), flash memory, and the like. In some examples, the memory may be external to processing circuitry 110 (e.g., may be external to a package in which processing circuitry 110 is housed).

Drivers 130 may be configured to drive pass devices 140 based on signals received from processing circuitry 110. Drivers 130 can include amplifiers and/or level shifters for generating relatively high-power signals based on low-power signals received from processing circuitry 110. For example, drivers 130 may include a first driver configured to drive a first pass device and a second driver configured to drive a second pass device, where each pass device is configured to connect to an LED. Additional example details of drivers for light emitting diodes can be found in commonly assigned U.S. Pat. No. 9,930,748, entitled "Synchronization for Light-Source Driver Circuitry," issued on Mar. 27, 2018, and commonly assigned U.S. Pat. No. 10,297,190, entitled "Pixel Selection Method for a Light-Source Matrix Driver," issued on May 21, 2019, the entire contents of which are incorporated herein by reference.

Pass devices 140 may be operated as switches that turn on and off. Additionally or alternatively, pass devices 140 may be operated as analog devices that can operate in a linear mode. In some examples, drivers 130 may be configured to drive pass devices 140 to increase or decrease the current level conducted by pass devices 140.

LEDs 150 may include two or more light sources such as light-emitting diodes (LEDs) or any other suitable light sources. Although described in the context of LEDs, the techniques of this disclosure also can apply to other light sources. LEDs 150 may be arrayed in a matrix or grid formation of columns and rows, and each light source may be a pixel. In some examples, LEDs 150 may include sixteen thousand and three hundred, and eighty-four light sources that are arrayed in a grid of one hundred and twenty-eight light sources by one hundred and twenty-eight light sources. Alternatively, LEDs 150 may include one thousand and twenty-four light sources that are arrayed in a grid of thirty-two light sources by thirty-two light sources.

Each of LEDs 150 may be driven by a respective one of pass devices 140. In some examples, each LED may be connected in series with a respective pass device between two power rails (e.g., power source 180). LEDs 150 may be part of an external device that can be mounted on and electrically connected to pads 160 and 170. Pads 160 may connect to the cathodes of LEDs 150, and pads 170 may connect to the anodes of LEDs 150. Alternatively, pads 160 may connect to the anodes of LEDs 150, and pads 170 may connect to the cathodes of LEDs 150, and power source 180 can be connected to pass devices 140. LEDs 150 may be connected between power source 180 and pass devices 140 as shown in FIG. 1, or the arrangement of pass devices 140 and LEDs 150 may be reversed such that such that pass devices 140 may be connected between power source 180 and LEDs 150 (see, e.g., FIG. 2).

Power source 180 may be configured to supply electrical power to LEDs 150 via pads 170 and 182. Power source 180 may include a battery or another power storage unit, a connection to mains power, and/or one or more power conversion circuits. Power source 180 may be external to device 100 in some examples, but in other examples, power source 180 may be a part of device 100. Device 100 may include one or more pads 182 to allow for power source 180 to mount on and electrically connect to device 100.

External device 192 can connect to diagnostic interface 190 to communicate with processing circuitry 110 and BIST 120. For example, processing circuitry 110 may be configured to transmit data related to the operation of device 100 to external device 192. In some examples, BIST 120 may receive a command signal (e.g., one or more bits) from external device 192 and may be configured to perform a built-in self-test in response to receiving the command signal. Additionally or alternatively, BIST 120 may be configured to perform a built-in self-test at the time of manufacture and/or at predefined time intervals. BIST 120 may be configured to perform a self-test before or after a hybridization process is complete (e.g., front-end or back-end), after the combined device is soldered to a printed circuit board (PCB), and/or when the device is operational in an end-use system (e.g., an automobile).

Testing for faults on LEDs 150 or on drivers 130 may be difficult where LEDs 150 are mounted on drivers 130. Where LEDs 150 are mounted on drivers 130, the node between an LED and a respective driver may be hidden or covered by the LED chip. Because some of the nodes are inaccessible, a test probe may not be able to reach these nodes to measure a current or voltage.

Analog testing equipment can be used to measure the forward voltages across each LED or at a pair of pads, but the measurement time is very long for a matrix with thousands of LEDs. Analog testing becomes prohibitively time-consuming and costly as the number of LEDs in a matrix steadily increases.

It is important to check the functioning of the LEDs and drivers to ensure that the final LED device will operate properly. Testing at several points in the manufacture and assembly processes allows for the prompt detection of faults. Testing at intermediate points also allows for determining the type and position of each fault, which can be used to troubleshoot and optimize the manufacture and assembly processes.

In accordance with the techniques of this disclosure, BIST 120 may be configured to detect a fault on drivers 130, pass devices 140, and/or LEDs 150 by separately testing each of drivers 130 or each of LEDs 150. To separately test a first driver or a first LED, BIST 120 may be configured to cause the first driver to turn on a first pass device that is configured to connect to the first LED. BIST 120 may be configured to then determine the voltage levels at the respective pair of pads 160 and 170 while the first pass device is activated. BIST 120 may be configured to separately test each of LEDs 150 one-by-one after LEDs 150 have been connected to pads 160 and 170. Based on the voltage levels, BIST 120 can determine whether a fault exists on the first LED or the first driver.

In some examples, BIST 120 may also be configured to determine the voltage across each of drivers 130 one-by-one. Based on the voltage across a driver, BIST 120 may be configured to determine whether a fault exists on the driver and/or whether a fault exists on the respective LED. BIST 120 may be configured to separately test each of drivers 130 one-by-one before and/or after LEDs 150 are connected to pads 160 and 170.

While performing the built-in self-test, BIST 120 can store a count of faults to memory 112. For example, BIST 120 may be configured to increment a counter in response to determining each fault. There may be multiple counters to record multiple types of fault. BIST 120 can store data indicating different categories of faults, such as short-circuit faults, open-circuit faults, LED faults, driver faults, etc. to memory 112. BIST 120 may be configured to store the positions and/or indices of each LED or driver that has a fault. BIST 120 can also store data relating to the forward voltages measured by processing circuitry 110. BIST 120 may be configured to output the data relating to the built-in self-test to external device 192.

Processing circuitry 110 may be configured to perform a remedial action in response to detecting a fault. For example, processing circuitry 110 may be configured to set a bit indicating the fault to prevent a driver from turning on a respective pass device to activate the respective LED. A user may be able to define the action to take in response to one or more possible faults. Processing circuitry 110 can store the option(s) selected by the user in memory 112, so that processing circuitry 110 can take the associated options.

BIST 120 may be configured to perform the testing routine based in the digital domain, which may be quicker than testing in an analog domain. For example, BIST 120 may be configured to test each LED in ten to twenty microseconds. By comparison, an analog testing routine may take approximately five to ten milliseconds to test each LED. Thus, the testing routine implemented by BIST 120 may be much faster than other testing methods such as analog testing methods.

In addition, the testing routine implemented by BIST 120 includes a voltage measurement at two points. One of the two measurement points may be the positive power source or the negative power source, which are more easily accessible than the node between an LED and a driver. BIST 120 may be configured to access the node between an LED and a driver using a connection network, which removes the need for manual connection to an internal node.

Figure 2:
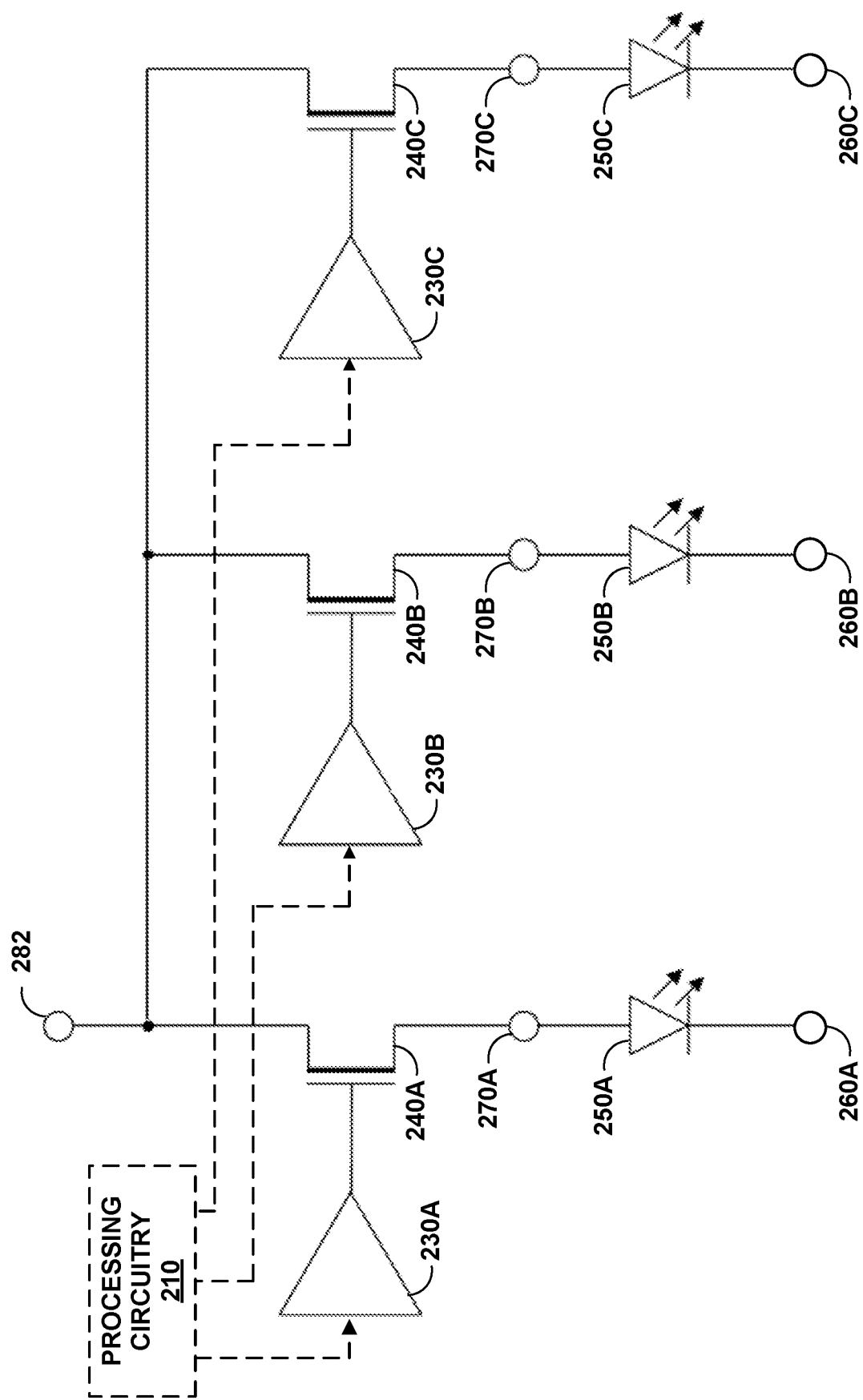
FIG. 2 is a circuit diagram of amplifiers for controlling pass devices connected in series with light emitting diodes (LEDs), in accordance with the techniques of this disclosure.

FIG. 2 is a circuit diagram of amplifiers 230A-230C for controlling pass devices 240A-240C connected in series with LEDs 250A-250C, in accordance with the techniques of this disclosure. A device of this disclosure may include processing circuitry 210, amplifiers 230A-230C, pass devices 240A-240C, cathode pads 260A-260C, anode pads 270A-270C, and power supply pad 282. In some examples, the device may also include LEDs 250A-250C and/or one or more power sources connected to cathode pads 260A-260C and/or and power supply pad 282.

Processing circuitry 210 may include digital logic configured to generate and deliver lower-power control signals to amplifiers 230A-230C. In some examples, each driver may include separate digital logic, rather than a single centralized block of processing circuitry 210. Additionally or alternatively, the device may include multiple blocks of digital logic, where each block generates control signals for more than one driver. The term "driver" as used in the description of FIG. 2 includes one of amplifiers 230A-230C and a respective one of pass devices 240A-240C. For example, a first driver can include amplifier 230A and pass device 240A, a second driver can include amplifier 230B and pass device 240B, and a third driver can include amplifier 230C and pass device 240C. Alternatively, the term driver could also include the digital logic for generating control signals.

Amplifiers 230A-230C may be configured to generate higher-power driver signals (e.g., by amplifying lower-power control signals) to drive pass devices 240A-240C. Amplifiers 230A-230C can deliver the driver signals to the control terminals (e.g., gate or base terminals) of pass devices 240A-240C. For example, amplifier 230A can activate pass device 240A by delivering a driver signal to the gate of pass device 240A. Amplifiers 230A-230C may be configured to also adjust the current flowing through pass devices 240A-240C by operating pass devices 240A-240C as analog devices, rather than operating pass devices 240A-240C as digital devices with only two states (on and off).

Pass devices 240A-240C may comprise, but are not limited to, any type of field-effect transistor (FET), a bipolar junction transistor (BJT), an insulated-gate bipolar transistor (IGBT), a high-electron-mobility transistor (HEMT), and/or another element that uses voltage for its control. Pass devices 240A-240C may include n-type transistors and/or p-type transistors. Pass devices 240A-240C may include elements such as silicon, silicon carbide, and/or gallium nitride. In some examples, pass devices 240A-240C include a freewheeling diode connected in parallel with a transistor to prevent reverse breakdown of the transistor.

LEDs 250A-250C may be formed on a separate chip from processing circuitry 210, amplifiers 230A-230C, and pass devices 240A-240C. The chip for LEDs 250A-250C may be attached after the manufacture of the device including processing circuitry 210, amplifiers 230A-230C, and pass devices 240A-240C. LEDs 250A-250C can be attached to pads 260A-260C and 270A-270C during a hybridization process that involves mounting and electrically connecting LEDs 250A-250C to pads 260A-260C and 270A-270C. Another attachment process may be used to connect a power source to pad 282, so that the power source can deliver electrical power to pass devices 240A-240C.

In some examples, there may be a one-to-one ratio of LEDs to pass devices and amplifiers. For example, an LED matrix may include approximately sixteen thousand LEDs, where the LED matrix block can be mounted on a device having approximately sixteen thousand pass devices and approximately sixteen thousand amplifiers. As another example, an LED matrix may include approximately one thousand LEDs, where the LED matrix block can be mounted on a device having approximately one pass devices and approximately one amplifiers. Alternatively, there may be fewer pass devices and amplifiers than LEDs, and each pass device may be configured to control more than one LED.

The configuration shown in FIG. 2 is just one example. The orientation of LEDs 250A-250C can be reversed such that pass devices 240A-240C are connected to the cathodes of LEDs 250A-250C. In addition, there may be only one cathode pad instead of multiple cathode pads 260A-260C, where the cathodes of LEDs 250A-250C may be connected together within the LED chip. In examples in which there is a single cathode pad, "pair of pads" refers to one of anode pads 270A-270C and the single cathode pad. In some examples, LEDs 250A-250C may be part of the same device as amplifiers 230A-230C and pass devices 240A-240C such that pads 260A-260C and 270A-270C are internal nodes rather than external pads.

A fault may exist on one of LEDs 250A-250C. The fault may be a short circuit (low or no resistance) or an open circuit (high or infinite resistance) across the LED. Processing circuitry 210 may be configured to detect a short circuit across an LED by determining that the voltage across the LED when the LED is activated is less than a minimum threshold voltage. Processing circuitry 210 may be configured to detect an open circuit across an LED by determining that the voltage across the LED when the LED is activated is greater than a maximum threshold voltage. The minimum and maximum threshold voltages may be the limits of an acceptable voltage range for activated LEDs. In response to determining a fault on an LED, processing circuitry 210 can store the position or index of the LED and/or increment a counter.

A fault may exist on one of amplifiers 230A-230C or one of pass devices 240A-240C. The fault may be a short circuit (low or no resistance) or an open circuit (high or infinite resistance) across the pass device, or some other fault on the amplifier. Processing circuitry 210 may be configured to detect a short circuit across a pass device by determining that the voltage across the pass device is greater than a first threshold voltage. Processing circuitry 210 may be configured to detect an open circuit across a pass device by determining that the voltage across the pass device is activated is less than a second threshold voltage.

Processing circuitry 210 may be configured to detect that a fault exists on an amplifier or a pass device before LEDs 250A-250C are attached to pads 26A-260C and 270A-270C. For example, a sense resistor may be connected to an anode pad and to a cathode pad, and processing circuitry 210 can detect the voltage across the sense resistor. Processing circuitry 210 may be configured to detect a short circuit across a pass device by determining that the voltage across the sense resistor when the pass device is activated is greater than a first threshold voltage. Processing circuitry 210 may be configured to detect an open circuit across a pass device by determining that the voltage across the LED when the pass device is activated is less than a second threshold voltage. The first and second threshold voltages may comprise an acceptable window for the voltage across a sense resistor before a hybridization process, where voltages outside of the acceptable window indicate a fault on the pass device.

Figure 3:
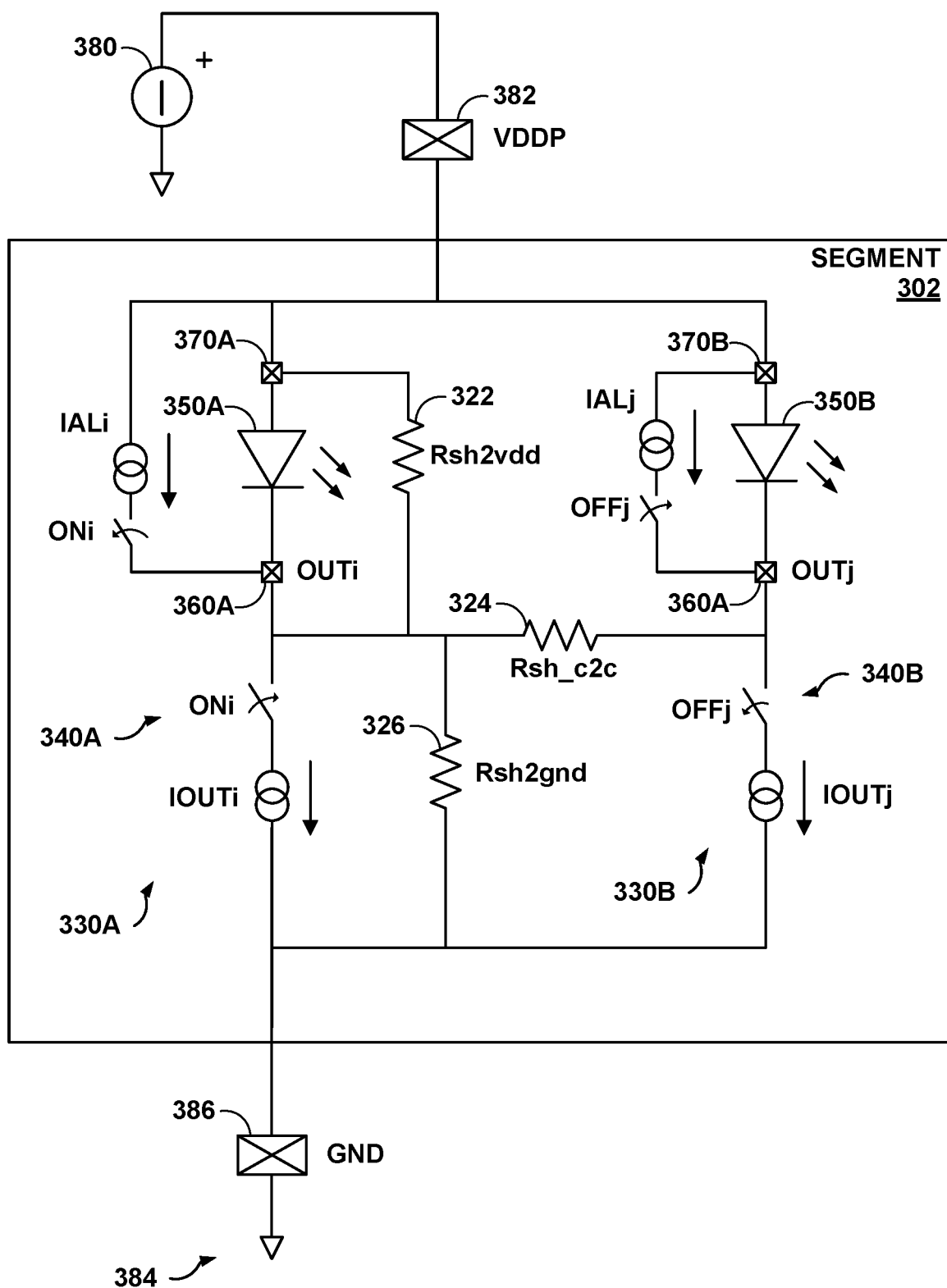
FIG. 3 is a circuit diagram of three possible failure modes for a driver or an LED, in accordance with the techniques of this disclosure.

FIG. 3 is a circuit diagram of three possible failure modes for a driver 330A or an LED 350A, in accordance with the techniques of this disclosure. Segment 302 includes drivers 330A and 330B, where each driver includes one of pass devices 340A and 340B, LEDs 350A and 350B, and pads 360A, 360B, 370A, and 370B. In some examples, LEDs 350A and 350B may be part of a separate device from drivers 330A and 330B.

Drivers 330A and 330B are depicted as current sources because turning on a pass device may allow current to flow through the respective LED. Each of drivers 330A and 330B may include an amplifier configured to drive a pass device, as shown in FIG. 2. When the pass device is turned on, current can flow through the pass device and the LED from power source 380 to power source 384. When the pass device is turned off, the current source IALi can sink or source current. The current source IALi may be part of driver 330A, and the current source IALj may be part of driver 330B.

A semiconductor die including LEDs 350A and 350B may be mounted on pads 360A, 360B, 370A, and 370B during a hybridization process. A single semiconductor die or semiconductor substrate may include all of the elements shown in FIG. 3, except LEDs 350A and 350B and power sources 380 and 384. In examples in which there is a single anode pad instead of multiple pads 370A and 370B, the anode terminals of LEDs 350A and 350B can be connected to the single anode pad during the hybridization process. In examples in which there is a single anode pad, each of cathode pads 360A and 360B may be paired with the single anode pad.

Resistances 322, 324, and 326 represent possible faults within segment 302. Resistance 322 represents a possible short-circuit fault or open-circuit fault across pads 360A and 370A (before hybridization) or across LED 350A (after hybridization). An open circuit is expected across pads 360A and 370A before hybridization. A BIST may be configured to detect a short-circuit fault across pads 360A and 370A or across LED 350A by determining that the forward voltage across pads 360A and 370A is less than a minimum threshold voltage. A BIST may be configured to detect an open-circuit fault across pads 360A and 370A or across LED 350A by determining that the forward voltage across pads 360A and 370A is greater than a maximum threshold voltage.

Resistance 324 represents a possible short-circuit fault or open-circuit fault between pads 360A and 360B (before or after hybridization) or between the anodes of LEDs 350A and 350B (after hybridization). A BIST may be configured to detect a fault between pads 360A and 360B based on the forward voltage across LED 350A and the forward voltage across LED 350B. As shown in FIG. 3, LEDs 350A and 350B are adjacent LEDs, but in some examples a fault can be detected between two non-adjacent LEDs.

Resistance 326 represents a possible short-circuit fault or open-circuit fault across driver 330A before or after a hybridization process occurs to attach LEDs 350A and 350B. A BIST may be configured to detect a short-circuit fault across driver 330A by determining that the voltage across driver 330A is less than a lower threshold voltage. A BIST may be configured to detect an open-circuit fault across driver 330A by determining that the voltage across driver 330A is greater than an upper threshold voltage.

A short circuit can be defined as resistance less than a minimum threshold resistance, not necessarily zero resistance. Thus, the voltage across a short circuit may be zero or a small, nonzero voltage. An open circuit can be defined as resistance greater than a maximum threshold resistance, not necessarily infinite resistance. The voltage across an open circuit may be infinite or a large, finite voltage.

Power sources 380 and 384 may be part of another external device. For example, pads 382 and 386 may be mounted on a PCB that includes connections to power sources 380 and 384. In some examples, each pad 382 and 386 may include multiple separate pads for parallel connections to, e.g., bond wires. Power sources 380 and 384 may include power rails for positive and negative power sources such as VDDP and a reference ground power source. Power sources 380 and 384 may include a power supply such as a battery or a connection to the mains power supply.

Figure 4:
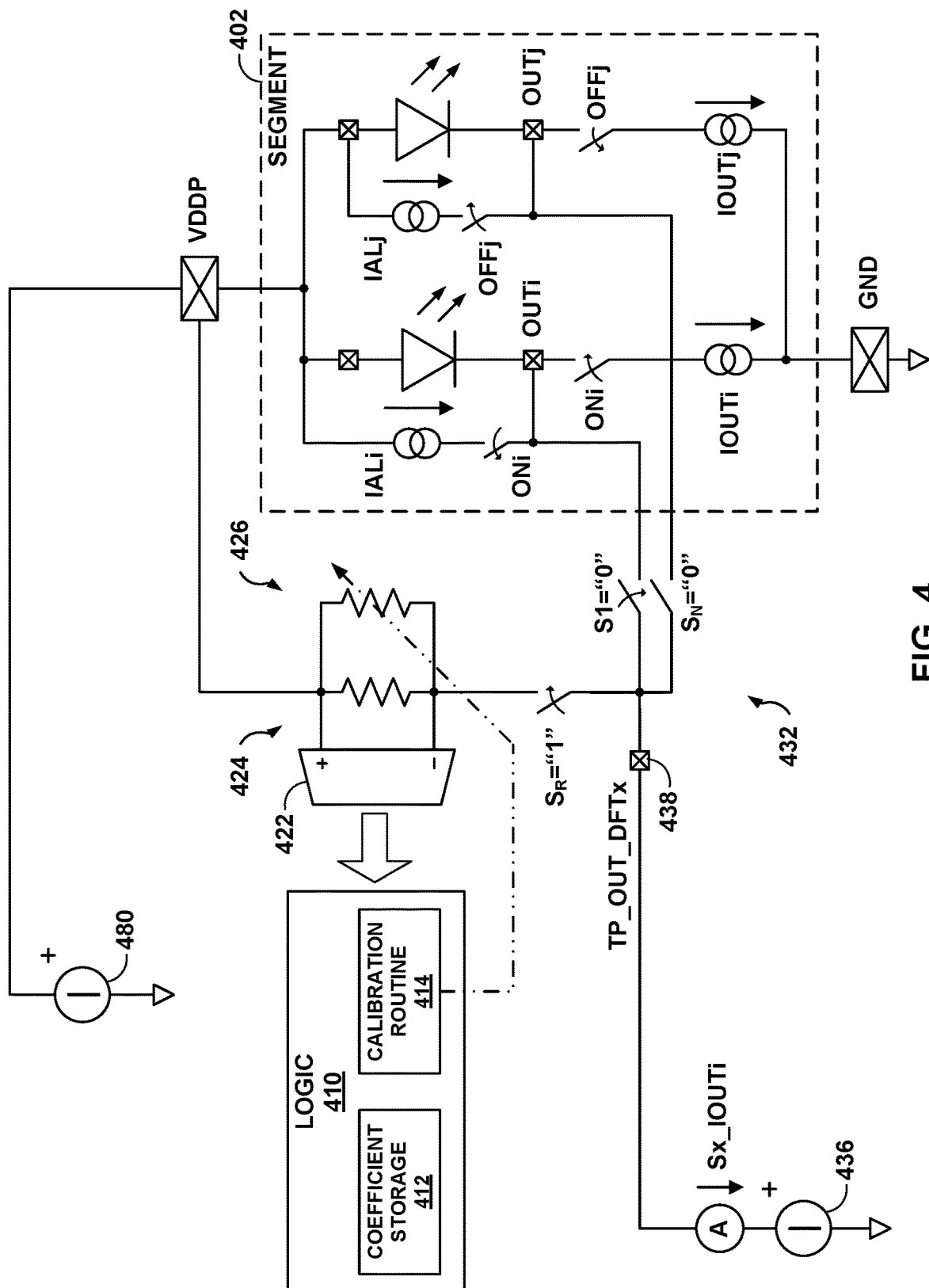
FIG. 4 is a circuit diagram for calibrating a sense resistor, in accordance with the techniques of this disclosure.

FIG. 4 is a circuit diagram for calibrating a sense resistor 424, in accordance with the techniques of this disclosure. Logic 410 may be configured to calibrate sense resistor 424 for front-end testing (e.g., before hybridization) in order to reduce or eliminate the spread of the resistance. Calibration of sense resistor 424 may provide a more accurate measurement of the absolute value of the current flowing through each of the LEDs in segment 402. Logic 410 may be configured to calibrate sense resistor 424 by varying the resistance of trimmable resistance 426.

Logic 410 may be configured to determine a trimming coefficient that represents the resistance of trimmable resistance 426. Logic 410 can store the trimming coefficient in coefficient storage 412, which may include one-time programmable memory, flash, or electrically erasable programmable read-only memory. Logic 410 may be configured to use the stored trimming coefficient in the application field in addition to front-end testing. Trimming is optional; alternatives include an external resistance or an untrimmed internal resistance. In some examples, the device may include an internal sense resistance, along with pads for connecting an optional external sense resistor. Alternatively, the device may include pads for an external resistor without any internal sense resistor. An external resistance may increase the number of components on an application board (e.g., PCB). Using an untrimmed internal resistance can result in a spread of the actual resistance value, possibly introducing imprecision in voltage sensing. Therefore, the resulting Gaussian distribution of the resistance could have a mean value that is offset from expected value.

Connection network 432 includes switches $S_1$, $S_N$, and $S_R$ for selecting and sensing various nodes in segment 402. To calibrate sense resistor 424, calibration routine 414 may be configured to open switches $S_1$ to $S_N$ and close switch $S_R$ to connect sense resistor 424 and trimmable resistance 426 to test pad 438. Current source 436 can force an external current from power source 480 through sense resistor 424 and trimmable resistance 426. Differential analog-to-digital converter (ADC) 422 can convert the voltage across sense resistor 424 to a digital number. Calibration routine 414 may be configured to perform a calibration routine by changing the equivalent resistance of trimmable resistance 426. Calibration routine 414 may be configured to store the trimming coefficient to coefficient storage 412. Additional example details of trimming can be found in commonly assigned U.S. Pat. No. 10,069,399, entitled "Selecting an Aspect Ratio for Current Monitoring." issued on Sep. 4, 2018, the entire contents of which are incorporated herein by reference.

Although FIGS. 4-6 and 10 depict a single ADC, in some examples a device may include more than one ADC to allow for testing the LEDs in parallel. For example, a device may include four ADCs, where each ADC is configured to test a subset (e.g., a quadrant) of the LEDs in the device. A device with multiple ADCs may be configured to perform multiple test routines in parallel, where each test routine uses one of the ADCs.

Figure 5:
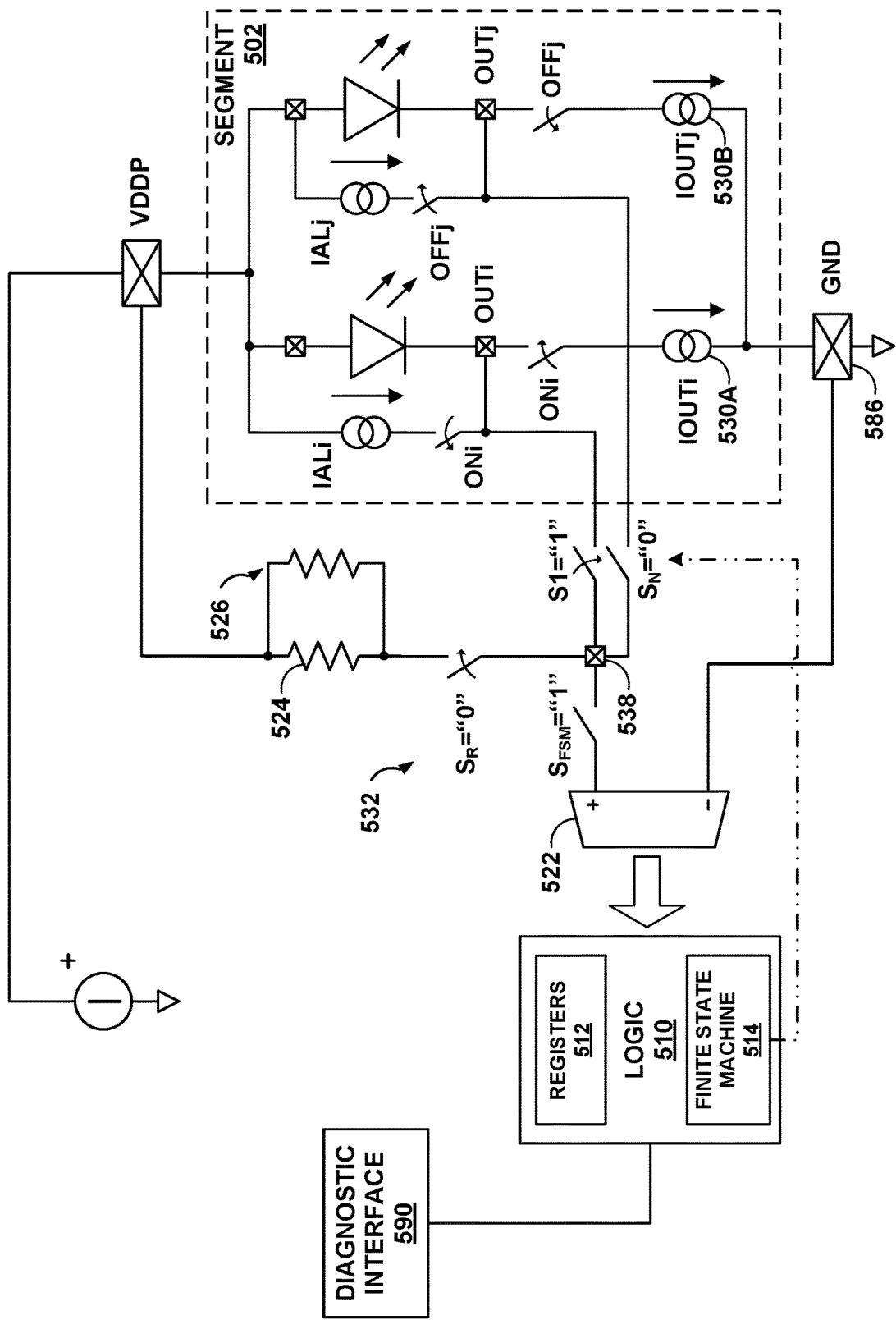
FIGS. 5 and 6 are circuit diagrams for detecting a fault, in accordance with the techniques of this disclosure.
Figure 6:
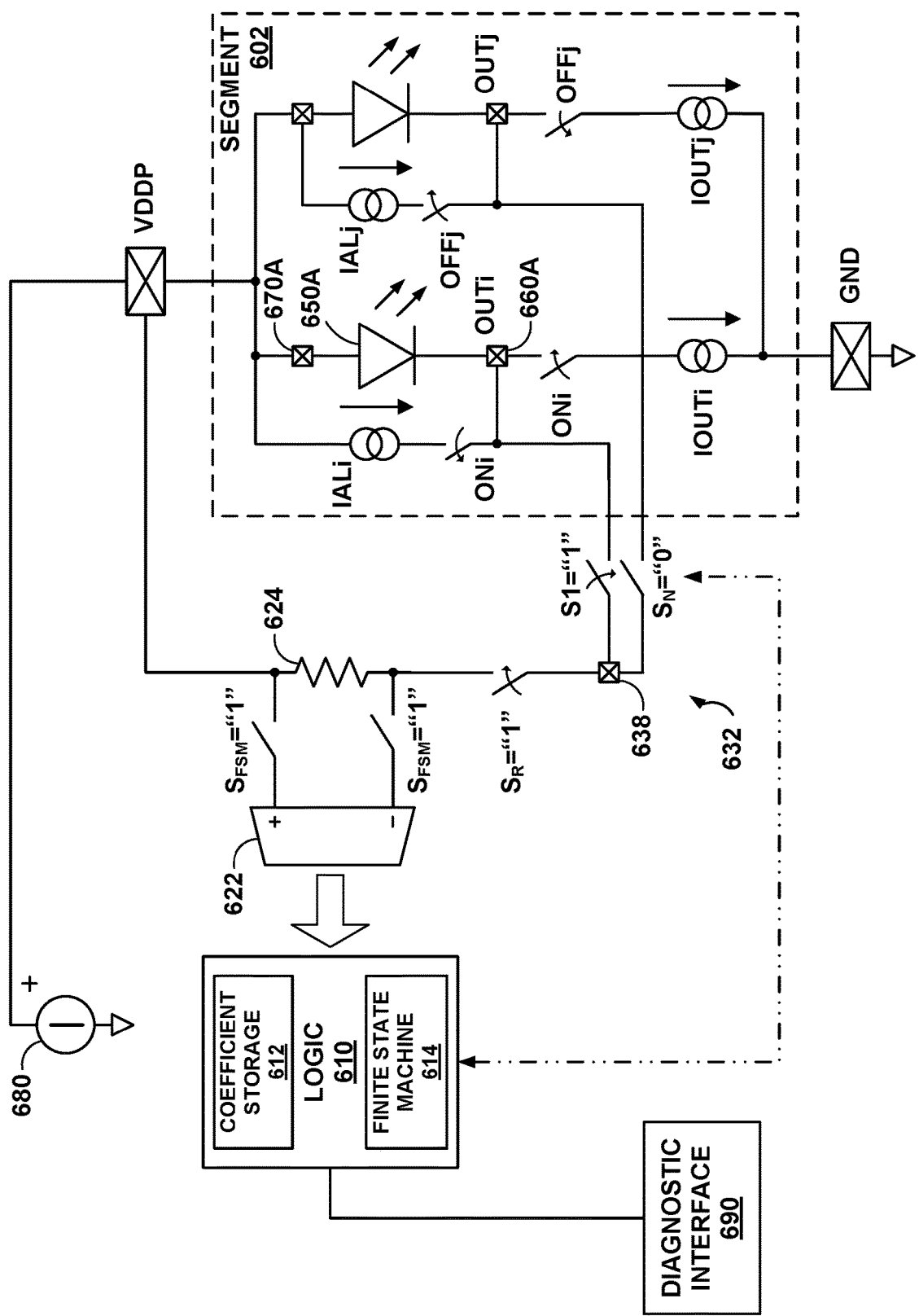

FIGS. 5 and 6 are circuit diagrams for detecting a fault, in accordance with the techniques of this disclosure. The testing routine setup shown in FIG. 5 allows for logic 510 to read the forward voltage of each LED. The testing routine shown in FIG. 5 can be used both in front-end testing (e.g., before hybridization) as well as back-end testing, end-of-line testing, and application field testing. Logic 510 may be configured to evaluate if an LED has been connected over a pair of pads or if an open circuit or a short circuit is instead present across the pair of pads.

To enable the routine, finite state machine (FSM) 514 may be configured to control connection network 532 to disconnect ADC 522 from sense resistor 524 by opening switch $S_R$. FSM 514 may be configured to then connect ADC 522 to test pad 538 by closing switch $S_{FSM}$. Test pad 538 is shared by all of the LEDs in segment 502, and logic 510 may be configured to connect the LEDs to test pad 538 one-by-one. FSM 514 can turn on the LEDs by activating drivers one-by-one, and ADC 522 can sequentially sense the forward voltage of the LED by controlling switches $S_1$ to $S_N$ that are connected to ADC 522. Alternatively. FSM 514 can turn on all of the LEDs in parallel, but this approach will result in higher power dissipation. FSM 514 can also turn on a batch of LEDs at once and proceed to determine the forward voltages across each of the LEDs.

ADC 522 can convert the forward voltage across current source 530A to a digital number. An internal logic calculator inside logic 510 may be configured to evaluate if the digital number is greater than a maximum threshold voltage or less than a minimum threshold voltage. Current source 530A is an example of a driver (e.g., an amplifier and a pass device) for controlling an LED.

In response to determining that the voltage across current source 530A is greater than an upper threshold voltage, logic 510 may be configured to store the corresponding pixel index and report an open-circuit condition. In response to determining that the voltage across current source 530A is less than a lower threshold voltage, logic 510 may be configured to store the corresponding pixel index and report a short-circuit condition. The upper and lower threshold voltages may comprise an acceptable window for the voltage across current source 530A. Logic 510 may be configured to store numbers of each fail count to registers 512. Logic 510 may then report the fail counts and positions of each fault to an external device via diagnostic interface 590.

Logic 510 may be configured to run the testing routine in the application field (e.g., during normal operation) by enabling the testing routine at the start-up of the device. Logic 510 may be configured to perform the testing routine at regular and/or predefined intervals, and/or logic 510 may be configured to perform the testing routine in response to receiving a command signal, for example, from an external device via diagnostic interface 590. Logic 510 may be configured to transmit the results of the testing routine via diagnostic interface 590 to an external device to inform the user of failed pixels and fault counts. The testing results can allow the user to screen for defective parts and to evaluate the outcome of the hybridization process.

FIG. 6 depicts a testing routine to measure the output current during front-end or back-end. For front-end testing (e.g., before hybridization process), logic 610 may be configured to check functionality of each current source in a reasonable time and in order to have statistical data with low effort for testing and for data storage. Logic 610 may be configured to test each current source in front-end post-assembly or back-end (e.g., after hybridization process), evaluate impact of the assembly process on the output current and distinguish if a fault is present on the LED-attachment side or on the current-source side. Post-assembly testing may be important to localize the position of the fault and also for field return analysis.

Sense resistor 624 may include an internal resistance (e.g., untrimmed or previously trimmed) or an external resistor. Logic 610 may be configured to control connection network 632 to cause the current from a driver to flow on sense resistor 624. Logic 610 may be configured to test the drivers one-by-one by connecting sense resistor 624 to a first driver, then connecting sense resistor 624 to a second driver, and so on. ADC 622 may be configured to sense the voltage across sense resistor 624, which indicates the voltage across the selected LED. ADC 622 can convert the voltage across sense resistor 622 into a digital number. The positive input of ADC 622 is configured to receive a first signal indicating the voltage level at a first end of sense resistor 624 (e.g., the end connected to power source 680). The negative input of ADC 622 is configured to receive a second signal indicating the voltage level at a second end of sense resistor 624 (e.g., the end connected to test pad 638).

To enable the automatic routine, FSM 614 may be configured to connect ADC 622 to sense resistor 624 by closing switches $S_{FSM}$ and to connect ADC 622 to test pad 638 by closing switch $S_R$. FSM 614 may be configured to turn on each driver one-by-one (or alternative all at once in parallel) and sequentially connect each current source to sense resistor 624. The current of the attached driver will flow through the sense resistor 624, and ADC 622 can convert the voltage across sense resistor 624. Based on Ohm's Law and the known resistance of sense resistor 624, logic 610 can determine the current conducted by the respective driver. Logic 610 may be configured to determine whether a fault exists on the driver based on whether the determined current falls within an acceptable range.

To determine whether a fault exists on a driver, logic 610 may be configured to evaluate whether the digital number outputted by ADC 622 is outside of an acceptable range, where the acceptable range is bound by a maximum threshold voltage and a minimum threshold voltage. For example, in response to determining that the forward voltage across LED 650A is greater than a maximum threshold voltage, logic 610 may be configured to determine that an open circuit exists across pads 660A and 670A. In response to determining that the forward voltage across LED 650A is less than a minimum threshold voltage, logic 610 may be configured to determine that a short circuit exists across pads 660A and 670A. Logic 610 may also be configured to determine whether the cathode terminal of LED 650A is properly connected to cathode pad 670A, or whether the connection is missing or impeded.

In response to determining that digital number is outside of the acceptable range, logic 610 may be configured to store the pixel index and/or an indication of the type of fault. Logic 610 may also be configured to store data to coefficient storage 612 such as fault count numbers, the minimum and maximum voltages (e.g., digital numbers outputted by ADC 622), and/or the average voltage. The minimum, maximum, and mean voltages may be based on all of the voltages sensed by ADC 622.

Logic 610 may be configured to store testing parameters to a set of registers. The testing parameters may include a bit for enabling output current measurement routine, a bit for enabling VLED forward voltage measurement routine, and a bit for enabling sense resistance calibration. The testing parameters can also include the settling time between two consecutive current source selections, the number of repetitive conversions on the same current source, high- and low-side limit (e.g., maximum and minimum threshold voltages), and maximum, minimum, and average threshold current and voltage values. The testing parameters may also include maximum and minimum pixel coordinate values for testing and one or more counters for the number of detected faults.

Logic 610 may be configured to report all of the stored data to an external device via diagnostic interface 690. With all the data stored in diagnostic registers, logic 610 can read-out the maximum, minimum, and mean values of the digital numbers and evaluate the Gaussian distribution and the process capability index (cpk) without the need to have statistical data of all the current sources. Logic 610 can perform the testing routine before or after the LEDs are mounted on the current sources. For example, sense resistor 624 can be connected in parallel to an LED. With an appropriate choice of the resistance value, the current can partially or fully bypass the LED and allow the current from the driver to flow on sense resistor 624. By setting the resistance of sense resistor 624 low enough, logic 610 can measure the current conducted by the driver by measuring the voltage across the sense resistor 624.

In examples in which logic 610 has identified a fault on an LED, logic 610 may be configured to check whether the fault exists on the LED and/or the respective driver by connecting sense resistor 624 in series with the driver. Logic 610 may be able to distinguish between an LED fault and a driver fault using the output current measurement using the configuration shown in FIG. 6.

Figure 7:
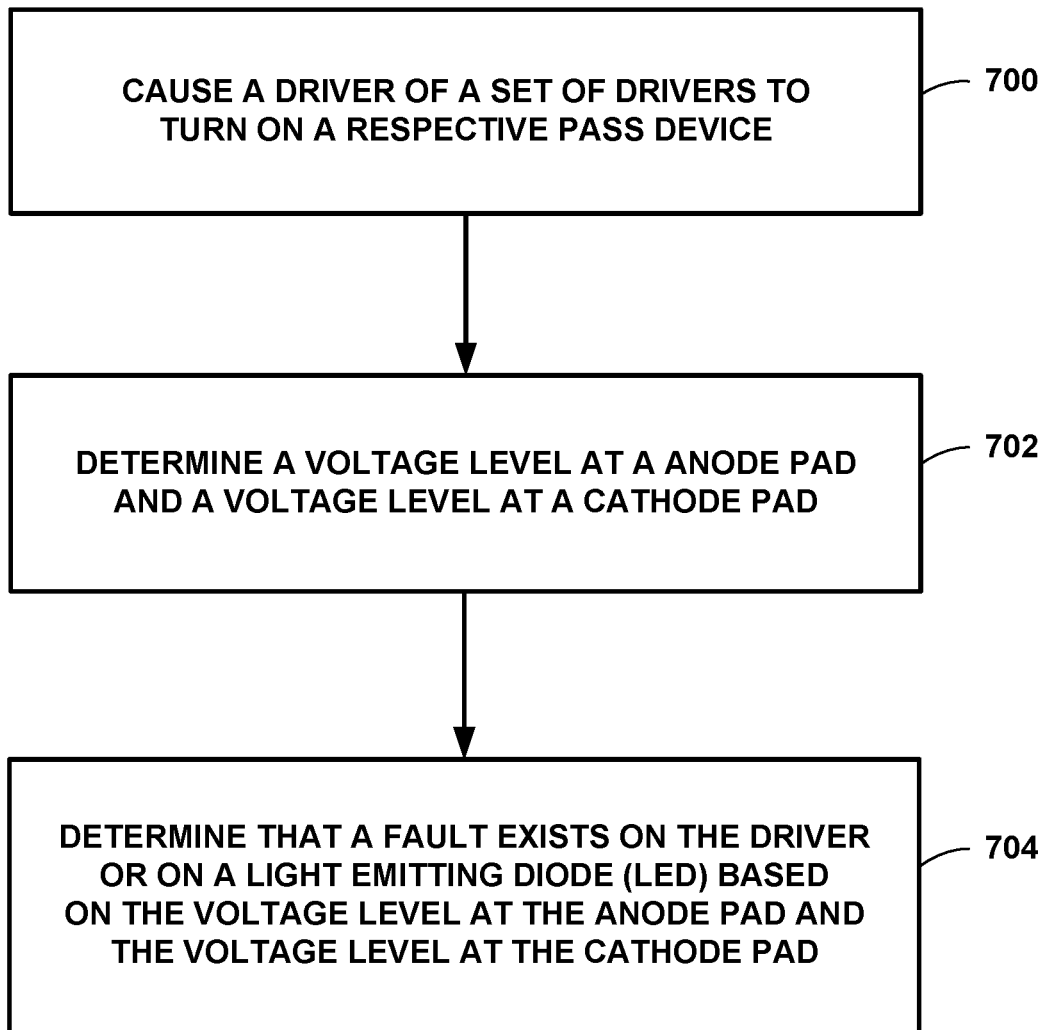
FIG. 7 is a flow diagram illustrating example techniques for detecting a fault, in accordance with the techniques of this disclosure.

FIG. 7 is a flow diagram illustrating example techniques for detecting a fault, in accordance with the techniques of this disclosure. The techniques of FIG. 7 are described with reference to the circuit shown in FIG. 2, although other components may exemplify similar techniques.

In the example of FIG. 7, processing circuitry 210 causes amplifier 230A of a first driver to turn on pass device 240A (700). Processing circuitry 210 can deliver a control signal to amplifier 230A, and amplifier 230A can generate a higher-power driver signal based on the control signal. In examples in which LED 250A is mounted on pads 260A and 270A, processing circuitry 210 can turn on LED 250A by controlling amplifier 230A to activate pass device 240A.

In the example of FIG. 7, processing circuitry 210 determines the voltage levels at anode pad 270A and at cathode pad 260A (702). To sense the voltage levels, processing circuitry 210 may be configured to control a connection network of switches to connect a sense resistor across pads 260A and 270A. A differential ADC may be configured to convert the voltage across the sense resistor to a digital number indicative of the voltage across pads 260A and 270A (e.g., the voltage difference between pads 260A and 270A).

In the example of FIG. 7, processing circuitry 210 determines that a fault exists on the driver or on LED 250A based on the voltage levels at pads 260A and 270A (704). In examples in which LED 250A has not yet been mounted on pads 260A and 270A, processing circuitry 210 may be configured to determine that a fault exists on the driver (e.g., amplifier 230A or pass device 240A) or across the gap between pads 260A and 270A, which should be an open circuit before LED 250A is attached.

In examples in which LED 250A has been mounted on pads 260A and 270A, processing circuitry 210 may be configured to first determine the voltage drop across pass device 240A while LED 250A is turned on. In response to detecting that the voltage drop across pass device 240A is outside of an acceptable range, processing circuitry 210 may be configured to then determine the voltage drop across pads 260A and 270A in order to determine whether the fault exists on pass device 240A and/or LED 250A. In examples in which processing circuitry 210 determines that both voltage levels are outside of the acceptable ranges, processing circuitry 210 may be configured to store an indication of two distinct faults.

Figure 8:
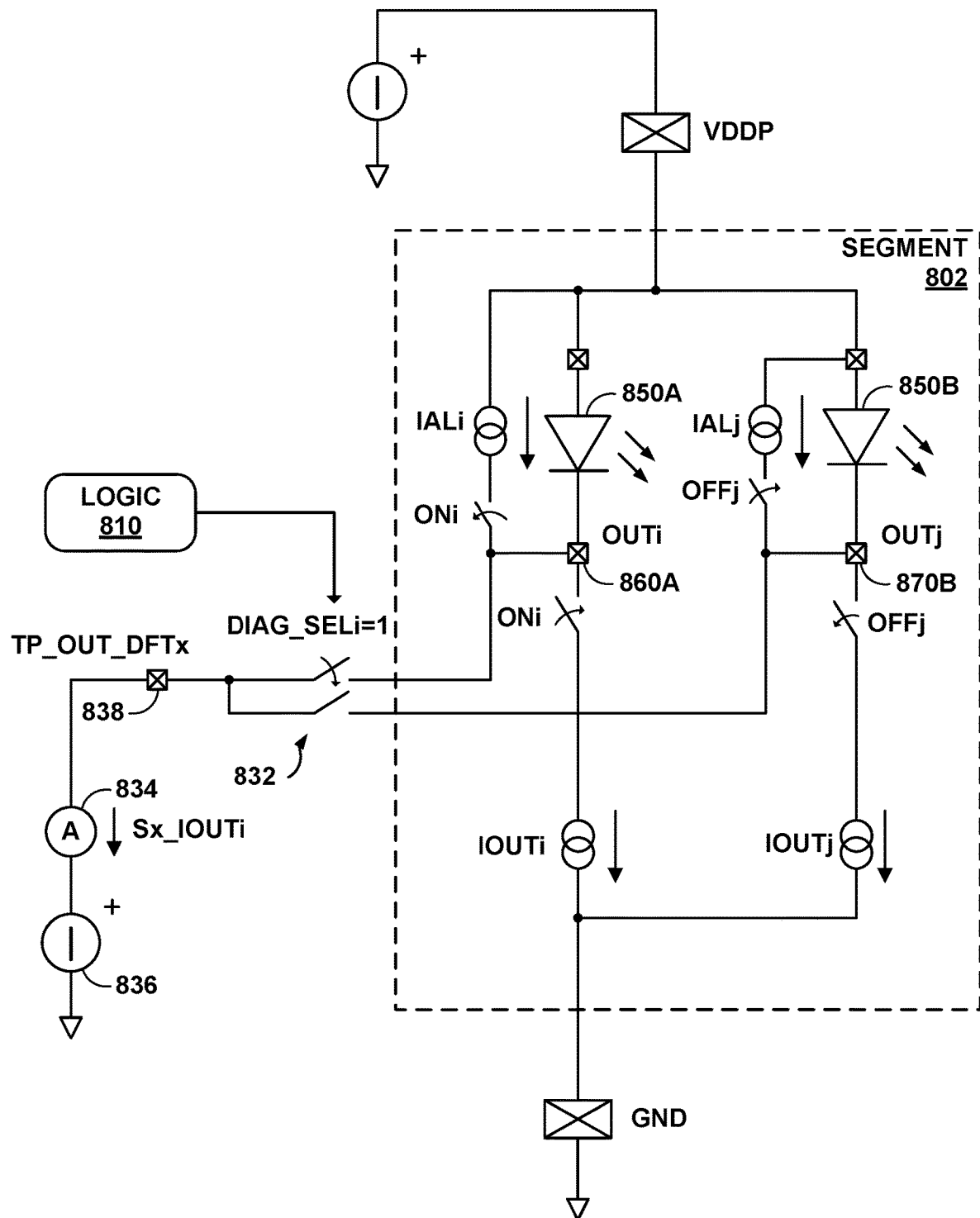
FIG. 8 is a circuit diagram for measuring the cathode voltage for two LEDs, in accordance with the techniques of this disclosure.

FIG. 8 is a circuit diagram for measuring the cathode voltage for two LEDs 850A and 850B, in accordance with the techniques of this disclosure. To detect a fault between LEDs 850A and 850B, logic 810 may be configured to control connection network 832 to connect cathode pads 860A and 860B one-by-one to test pad 838. While cathode pad 860A is connected to test pad 838, for example, current source 836 can sink current from LED 850A.

Current sensor 834 is configured to measure the current conducted by current source 836. Logic 810 can determine whether an LED-to-LED fault exists based on the current sensed by current sensor 834 while cathode pad 860A is connected to test pad 838 and while cathode pad 860B is connected to test pad 838. For example, logic 810 may be configured to force a current through LED 850A (e.g., by activating driver 830A) and checking whether the current is present at cathode pad 860B. The current from LED 850A should not be present on cathode pad 860B unless there is a relatively low resistance pathway between cathode pads 860A and 860B.

Figure 9A:
FIGS. 9A and 9B are diagrams of two example test patterns that can be implemented by a built-in self-test, in accordance with the techniques of this disclosure.
Figure 9B:

FIGS. 9A and 9B are diagrams of two example test patterns 900A and 900B that can be implemented by a BIST, in accordance with the techniques of this disclosure. The BIST may be configured to perform automatically perform a low-power testing routine using test patterns 900A and 900B. Test patterns 900A and 900B use a complementary chess-board pattern. The BIST may be configured to detect a specific failure mode using test patterns 900A and 900B: an LED-to-LED short circuit.

Test patterns 900A and 900B, together with the automatic measurement of internal parameters via a differential ADC, allow for fully automatic detection of LED-to-LED failures (e.g., for verification of channel-to-channel crosstalk). For each of test patterns 900A and 900B, the BIST can create a complementary chessboard pattern by setting the status of an ith cell to 100% (activated) and setting the status of an (i+1)th cell to 0% (deactivated). The cells may be numbered sequentially so that the first cell is adjacent to the second cell, the second cell is adjacent to the third cell, and so on down the row. If the sixteenth cell is at the end of a row, the seventeenth cell is at the beginning of the next row. Test pattern 900B is the inverse of test pattern 900A.

For test pattern 900A, the BIST may be configured to turn on a first subset of the LEDs. The first subset may include a first LED, a third LED, a fifth LED, and so on. For test pattern 900A, the BIST may also be configured to turn off a second subset of the LEDs. The second subset may include a second LED, a fourth LED, a sixth LED, and so on. The first and second subsets of LEDs may form a chessboard or checkerboard pattern, as shown in FIGS. 9A and 9B. Other test patterns ar possible, such as ring patterns or stripe patterns. For example, a test pattern can allow for sensing a fault between two diagonally positioned LEDs (e.g., different row and different column).

Figure 10:
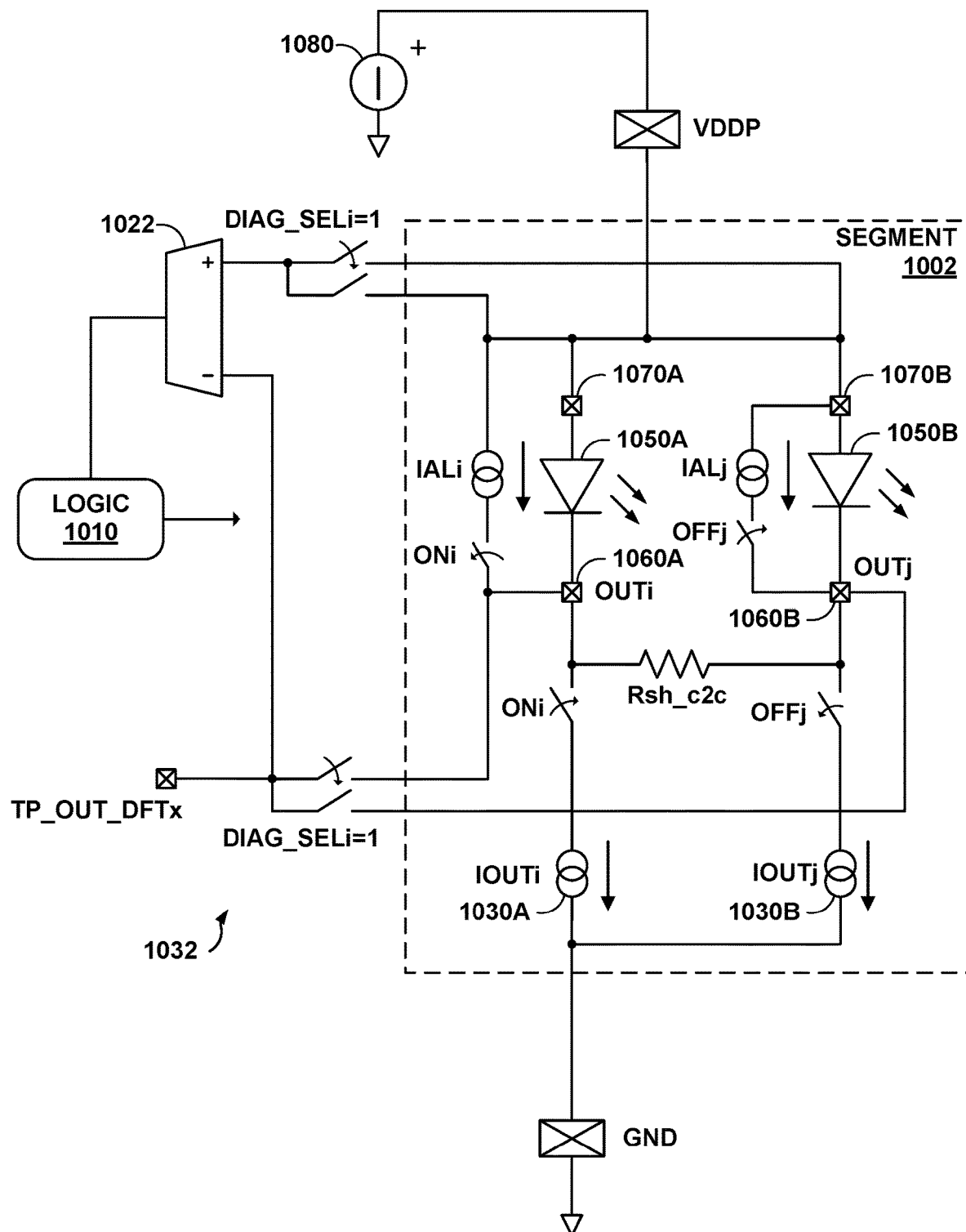
FIG. 10 is a circuit diagram of a device including a differential analog-to-digital converter for measuring the forward voltage across an LED, in accordance with the techniques of this disclosure.

FIG. 10 is a circuit diagram of a device including a differential ADC 1022 for measuring the forward voltage across an LED, in accordance with the techniques of this disclosure. When applying the dedicated light pattern, logic 1010 may be configured to perform an automatic routine involving the measurement of the forward voltage across each LED of an entire matrix using ADC 1022. To enable the automatic routine, logic 1010 may be configured to control a connection network 1032 to connect ADC 1022 to power source 1080 and to cathode pad 1060A or 1060B of the selected pixel using the switches labeled DIAG_SEL.

Logic 1010 may include an internal FSM configured to automatically enable ADC 1022 to convert of the forward voltage of each LED to a digital number. An internal logic calculator may be configured to evaluate whether the forward voltage of the activated LED pixel is within an acceptable range for activated LEDs. The internal logic calculator may also be configured to evaluate whether the forward voltage of the deactivated LED pixel is within an acceptable range for deactivated LEDs. In the example depicted in FIG. 10, LED 1050A is an activated LED, and LED 1050B is a deactivated LED.

Each of the acceptable ranges may include a respective upper threshold and a respective lower threshold. The acceptable range for activated LEDs can include the typical forward voltage for an LED, which may be between 1.7 volts and 3.3 volts, depending on the type of LED. The upper threshold voltage for activated LEDs may be a range from four to five volts, such as 4.5 volts. In examples in which LED 1050A includes multiple LEDs connected in series, the typical voltage may be higher than 3.3 volts. The acceptable range for deactivated LEDs can include zero volts. Each acceptable range may be broader than the typical voltage; for example, the acceptable range for a deactivated LED could be negative 0.3 volts to positive 0.6 volts. Thus, to determine whether a fault exists between cathode pads 1060A and 1060B, logic 1010 may be configured to determine whether the forward voltage of LED 1050A is less than a lower threshold voltage for activated LEDs and determine whether the forward voltage of LED 1050B is greater than an upper threshold voltage for deactivated LEDs.

In some examples, the expected forward voltage for an activated LED is approximately three volts above reference ground at the GND node, and the voltage level of VDDP is four volts above reference ground. Thus, the expected voltage level at cathode pad 1060A is approximately one volt above reference ground. Logic 1010 may be configured to detect a short from cathode pad 1060A to VDDP or some other fault in response to determining that the voltage level at cathode pad 1060A is greater than an upper threshold voltage, such as two volts above reference ground. Logic 1010 may be configured to detect a short from cathode pad 1060A to reference ground in response to determining that the voltage level at cathode pad 1060A is less than a lower threshold voltage, such as 0.5 volts above reference ground.

If the converted values for the forward voltages across LEDs 1050A and 1050B are outside the respective acceptable ranges means that a dirty resistance is placed between adjacent pixels. For example, an open circuit (e.g., high resistance) may be desirable between cathode pads 1060A and 1060B. If the resistance decreases below an acceptable level, the voltages at cathode pads 1060A and 1060B, as measured by ADC 1022, will not be within the acceptable voltage ranges.

Logic 1010 may be configured to store the number of detected faults and the positions of each fault in a memory. Logic 1010 may be further configured to report this data to an external device via a diagnostic interface. Testing for a fault between LEDs can occurred at the back-end, the end-of-line, or in the field. Back-end testing may occur after a hybridization process is complete, end-of-line testing may occur after the LED device is fully assembled, and field testing can occur after the device is installed and operating.

The testing parameters for LED-to-LED testing may include a stored value for the type of chessboard pattern, a value for the settling time between two consecutive current source selections, the number of repetitive conversions on the same current source, high- and low-side limit (e.g., maximum and minimum threshold voltages), and maximum, minimum, and average threshold current and voltage values. The testing parameters may also include maximum and minimum pixel coordinate values for testing and one or more counters for the number of detected faults.

Figure 11:
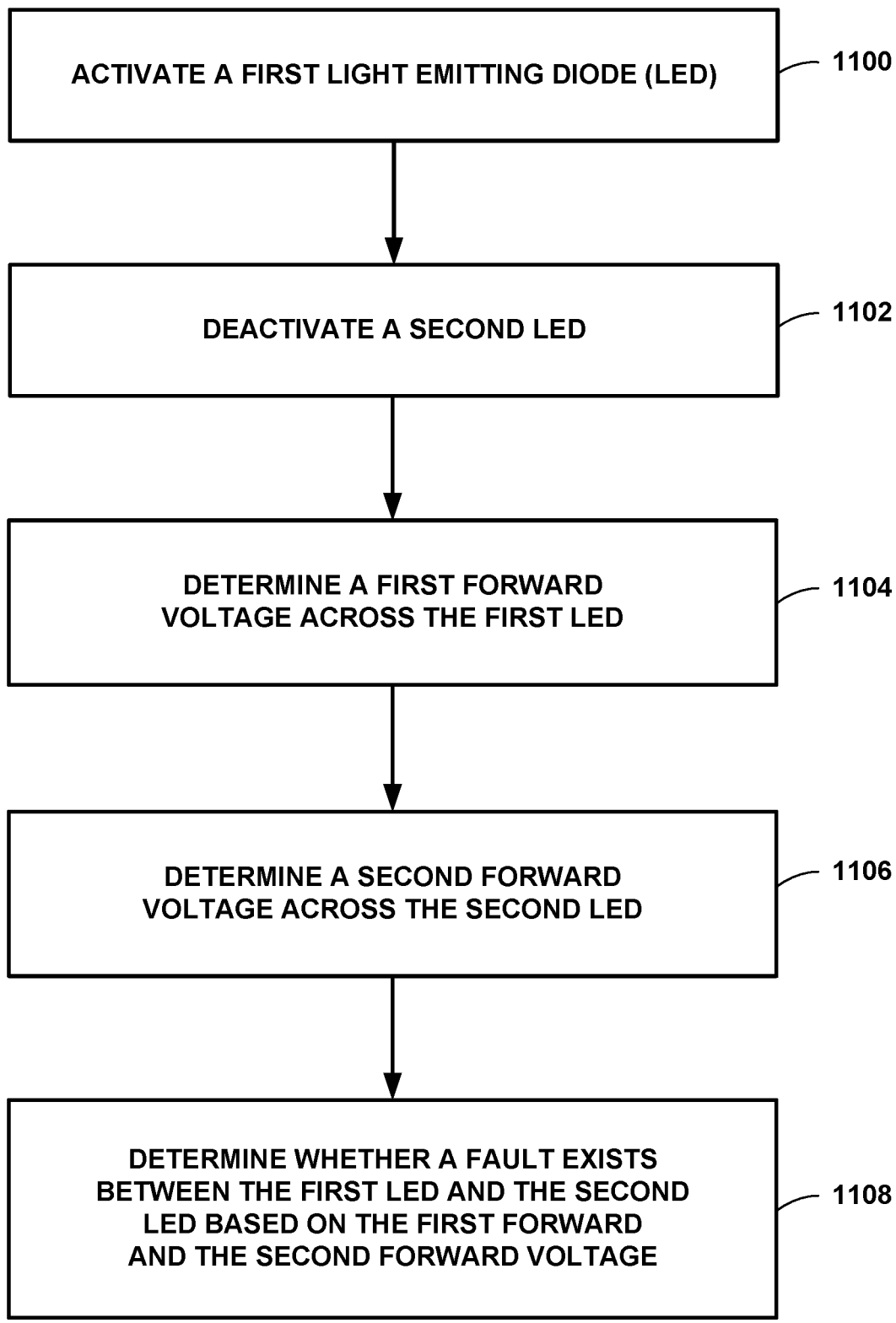
FIG. 11 is a flow diagram illustrating example techniques for detecting a fault between two LEDs, in accordance with the techniques of this disclosure.

FIG. 11 is a flow diagram illustrating example techniques for detecting a fault between two LEDs, in accordance with the techniques of this disclosure. The techniques of FIG. 11 are described with reference to the circuit shown in FIG. 10, although other components may exemplify similar techniques.

In the example of FIG. 11, logic 1010 activates LED 1050A (1000) and deactivates LED 1050B (1002). Logic 1010 can activate LED 1050A by causing driver 1030A to activate a pass device connected to LED 1050A. Activating this pass device allows current to flow through LED 1050A. Logic 1010 can deactivate LED 1050B by causing driver 1030B to deactivate a pass device connected to LED 1050AB. Activating this pass device prevents or reduces current from flowing through LED 1050B.

In the example of FIG. 11, logic 1010 determines the forward voltage across LED 1050A (1004) and the forward voltage across LED 1050B (1006). Logic 1010 can measure the forward voltage across LED 1050A by connecting ADC 1022 across pads 1060A and 1070A. Logic 1010 may be configured to then control connection network 1032 to disconnect ADC 1022 from pads 1060A and 1070A and connect ADC 1022 to pads 1060B and 1070B, but in other examples the anode pads of adjacent LEDs may not be directly connected. In the example of FIG. 10, anode pad 1070A is connected to anode pad 1070B. ADC 1022 can convert each forward voltage to a digital number that is stored in memory by logic 1010.

In the example of FIG. 11, logic 1010 determines whether a fault exists between LEDs 1050A and 1050B based on the forward voltages across LEDs 1050A and 1050B (1008). For example, logic 1010 may be configured to determine whether each of the forward voltages is within an acceptable voltage range. Logic 1010 may also be configured to measure the voltage across driver 1030A and/or 1030B in order to determine whether the fault exists across a single LED or across a single driver. In response to determining that a fault exists between cathode pads 1070A and 1070B, logic 1010 may be configured to increment a fault counter and store the positions of LEDs 1050A and 1050B.

This disclosure has attributed functionality to processing circuitry 110 and 210, BIST 120, and logic 410, 510, 610, 810, and 1010. Processing circuitry 110 and 210, BIST 120, and logic 410, 510, 610, 810, and 1010 may include one or more processors. Processing circuitry 110 and 210, BIST 120, and logic 410, 510, 610, 810, and 1010 may include any combination of integrated circuitry, discrete logic circuitry, analog circuitry, such as one or more microprocessors, digital signal processors (DSPs), application specific integrated circuits (ASICs), and/or field-programmable gate arrays (FPGAs). In some examples, processing circuitry 110 and 210, BIST 120, and logic 410, 510, 610, 810, and 1010 may include multiple components, such as any combination of one or more microprocessors, one or more DSPs, one or more ASICs, or one or more FPGAs, as well as other discrete or integrated logic circuitry, and/or analog circuitry.

The techniques described in this disclosure may also be embodied or encoded in an article of manufacture including a non-transitory computer-readable storage medium, such as processing circuitry 110 and 210, BIST 120, and logic 410, 510, 610, 810, and 1010. Example non-transitory computer-readable storage media may include RAM, ROM, programmable ROM (PROM), erasable programmable ROM (EPROM), electronically erasable programmable ROM (EEPROM), flash memory, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

The following numbered examples demonstrate one or more aspects of the disclosure.

Example 1. A method for a built-in self-test to detect a fault includes causing a first driver of a set of drivers to turn on a first respective pass device, wherein each driver of the set of drivers includes a pass device configured to electrically connect to a respective pad of the at least one anode pad or the at least one cathode pad, and wherein each driver of the set of drivers is configured to control whether a respective LED of the set of LEDs is turned on or off. The method also includes determining a first voltage level at a first anode pad of the at least one anode pad and determining a first voltage level at a first cathode pad of the at least one cathode pad. The method further includes determining that a fault exists on the first driver, across the first anode pad and the first cathode pad, or on a first LED based on the first voltage levels at the first anode pad and the first cathode pad.

Example 2. The method of example 1, further including determining the first voltage levels at the first anode pad and the first cathode pad by determining a voltage drop across a sense resistor while the sense resistor is connected across the first anode pad and the first cathode pad.

Example 3. The method of example 1 or example 2, further including separately testing each driver of the set of drivers one-by-one or each LED of the set of LEDs one-by-one by at least causing the sense resistor to be connected across a second anode pad of the at least one anode pad and a second cathode pad of the at least one cathode pad and determining second voltage levels at the second anode pad and at the second cathode pad while the sense resistor is connected across the second anode pad and the second cathode pad.

Example 4. The method of examples 1-3 or any combination thereof, wherein separately testing each driver or each LED one-by-one includes causing a second driver of the set of drivers to turn on a second respective pass device.

Example 5. The method of examples 1-4 or any combination thereof, wherein separately testing each driver or each LED one-by-one includes determining that a fault exists on the second driver or on a second LED based on the second voltage levels at the second anode pad and the second cathode pad.

Example 6. The method of examples 1-5 or any combination thereof, wherein separately testing each driver or each LED one-by-one includes controlling the connection network to connect the sense resistor across the first anode pad and the first cathode pad before determining the first voltage levels.

Example 7. The method of examples 1-6 or any combination thereof, wherein separately testing each driver or each LED one-by-one includes controlling the connection network to disconnect the sense resistor from the first anode pad and the first cathode pad before determining the second voltage levels.

Example 8. The method of examples 1-7 or any combination thereof, wherein separately testing each driver or each LED one-by-one includes controlling the connection network to connect the sense resistor across the second anode pad and the second cathode pad before determining the second voltage levels.

Example 9. The method of examples 1-8 or any combination thereof, further including outputting, by a differential ADC, a digital number indicating a voltage drop across the sense resistor to the processing circuitry.

Example 10. The method of examples 1-9 or any combination thereof, wherein determining that the fault exists is based on the digital number.

Example 11. The method of examples 1-10 or any combination thereof, further including causing a current source to deliver a test current to the sense resistor while the sense resistor is disconnected from the at least one anode pad and the at least one cathode pad.

Example 12. The method of examples 1-11 or any combination thereof, further including determining a voltage drop across the sense resistor while the test current is being delivered to the sense resistor.

Example 13. The method of examples 1-12 or any combination thereof, further including changing a resistance of the sense resistor based on the determined voltage drop across the sense resistor.

Example 14. The method of examples 1-13 or any combination thereof, further including changing the resistance of the sense resistor using a trimming coefficient.

Example 15. The method of examples 1-14 or any combination thereof, further including storing the trimming coefficient to a memory.

Example 16. The method of examples 1-15 or any combination thereof, wherein determining that the fault exists includes determining that a difference between the first voltage level at the first anode pad and the voltage level at the first cathode pad is greater than an upper threshold.

Example 17. The method of examples 1-16 or any combination thereof, wherein determining that the fault exists includes determining that an open circuit exists across the first anode pad and the first cathode pad in response to determining that the difference between the first voltage levels is greater than the upper threshold.

Example 18. The method of examples 1-17 or any combination thereof, wherein determining that the fault exists includes determining that a difference between the first voltage level at the first anode pad and the voltage level at the first cathode pad is less than a lower threshold.

Example 19. The method of examples 1-18 or any combination thereof, wherein determining that the fault exists includes determining that a short circuit exists across the first anode pad and the first cathode pad in response to determining that the difference between the first voltage levels is less than the lower threshold.

Example 20. The method of examples 1-19 or any combination thereof, further including storing a count of faults to the memory.

Example 21. The method of examples 1-20 or any combination thereof, further including storing a first count of detected open-circuit faults to the memory and storing a second count of detected short-circuit faults to the memory.

Example 22. The method of examples 1-21 or any combination thereof, further including outputting the count of faults to an external device via a diagnostic interface.

Example 23. The method of examples 1-22 or any combination thereof, further including determining whether the count of faults is greater than a threshold number and outputting the count of faults to the external device in response to determining that the count of faults is greater than the threshold number.

Example 24. The method of examples 1-23 or any combination thereof, further including determining a minimum value of voltage differences across each respective anode pad of the at least one anode pad and each respective cathode pad of the at least one cathode pad.

Example 25. The method of examples 1-24 or any combination thereof, further including determining a maximum value of voltage differences across each respective anode pad of the at least one anode pad and each respective cathode pad of the at least one cathode pad.

Example 26. The method of examples 1-25 or any combination thereof, further including determining a mean value of voltage differences across each respective anode pad of the at least one anode pad and each respective cathode pad of the at least one cathode pad.

Example 27. The method of examples 1-26 or any combination thereof, further including storing the minimum value, the maximum value, and the mean value to a memory.

Example 28. The method of examples 1-27 or any combination thereof, further including outputting the minimum value, the maximum value, and the mean value to an external device via a diagnostic interface.

Example 29. The method of examples 1-28 or any combination thereof, further including concurrently test a plurality of drivers of the set of drivers or a plurality of LEDs of the set of LEDs as a batch by at least causing the plurality of drivers to turn on a respective plurality of pass devices one-by-one, determining a plurality of voltage differences across respective pads one-by-one while a pass device of the respective plurality of pass devices are turned on, and determining whether any faults exist based on the plurality of voltage differences. The plurality of drivers comprises less than all of the set of drivers, and the plurality of LEDs comprises less than all of the set of LEDs.

Example 30. The method of examples 1-29 or any combination thereof, further including receiving a signal from an external device via a diagnostic interface and determining whether the fault exists in response to receiving the signal from the external device.

Example 31. The method of examples 1-30 or any combination thereof, wherein determining whether the fault exists occurs before and after a hybridization process.

Example 32. The method of examples 1-31 or any combination thereof, further including determining whether the fault exists across the first anode pad and the first cathode pad before a hybridization process.

Example 33. The method of examples 1-32 or any combination thereof, wherein determining whether the fault exists on the first LED occurs after the hybridization process.

Example 34. The method of examples 1-33 or any combination thereof, wherein the hybridization process includes mounting the device on a structure including the set of LEDs and electrically connecting the set of switches to the set of LEDs.

Example 35. A device includes a built-in self-test for detecting a fault, the device further including at least one anode pad configured to connect to anodes of a set of LEDs and at least one cathode pad configured to connect to cathodes of the set of LEDs. The device further includes a set of drivers, wherein each driver of the set of drivers includes a pass device configured to electrically connect to a respective pad of the at least one anode pad or the at least one cathode pad, and wherein each driver of the set of drivers is configured to control whether a respective LED of the set of LEDs is turned on or off. The device also includes processing circuitry configured to separately test each driver of the set of drivers one-by-one or each LED of the set of LEDs one-by-one by at least causing a first driver of the set of drivers to turn on a first respective pass device, determining a first voltage level at a first anode pad of the at least one anode pad, determining a first voltage level at a first cathode pad of the at least one cathode pad, and determining that a fault exists on the first driver, across the first anode pad and the first cathode pad, or on a first LED based on the first voltage levels at the first anode pad and the first cathode pad.

Example 36. The device of example 35, further including a sense resistor configured to be connected to the first anode pad and to the first cathode pad.

Example 37. The device of example 35 or example 36, further including a differential ADC configured to measure the voltage across a sense resistor.

Example 38. The device of examples 35-37 or any combination thereof, further including a connection network configured to connect to the first anode pad and the first cathode pad.

Example 39. The device of examples 35-38 or any combination thereof, further including a memory configured to store a trimming coefficient for a sense resistor.

Example 40. The device of examples 35-39 or any combination thereof, further including a memory configured to store a minimum value, a maximum value, and a mean value of voltage differences across each LED, each pair of pads, and/or each driver.

Example 41. The device of examples 35-40 or any combination thereof, wherein the processing circuitry includes a state machine configured to cause the set of drivers to turn on and off pass devices one by one as part of a self test.

Example 42. The device of examples 35-41 or any combination thereof, wherein the processing circuitry is configured to perform the method of examples 1-34 or any combination thereof.

Example 43. A device includes a computer-readable medium having executable instructions stored thereon, configured to be executable by processing circuitry for causing the processing circuitry to perform the method of examples 1-34 or any combination thereof.

Example 44. A system includes means for performing the method of examples 1-34 or any combination thereof.

Example 45. A method for a built-in self-test to detect a fault between a first LED and a second LED of a set of LEDs includes causing a first driver of a set of drivers to turn on a first respective pass device. Each driver of the set of drivers includes a pass device configured to electrically connect to a respective pad of the at least one anode pad or the at least one cathode pad, and wherein each driver of the set of drivers is configured to control whether a respective LED of the set of LEDs is turned on or off. The method also includes causing a second driver of the set of drivers to control a second respective pass device to turn off the second LED, determining a first forward voltage across the first LED, and determining a second forward voltage across the second LED. The method further includes determining that a fault exists between a first LED and a second LED of the set of LEDs based on the first and second forward voltages.

Example 46. The method of example 45, further including determining whether the first forward voltage is outside of a first acceptable range for activated LEDs.

Example 47. The method of example 45 or example 46, further including determining whether the second forward voltage is outside of a second acceptable range for deactivated LEDs.

Example 48. The method of examples 45-47 or any combination thereof, wherein determining that the fault exists includes determining that the first forward voltage is outside of the first acceptable range.

Example 49. The method of examples 45-48 or any combination thereof, wherein determining that the fault exists includes determining that the second forward voltage is outside of the second acceptable range.

Example 50. The method of examples 45-49 or any combination thereof, wherein determining whether the first forward voltage is outside of the first acceptable range includes determining that the first forward voltage is less than a first threshold level for activated LEDs.

Example 51. The method of examples 45-50 or any combination thereof, wherein determining whether the second forward voltage is outside of the second acceptable range includes determining that the second forward voltage is greater than a second threshold level for deactivated LEDs.

Example 52. The method of examples 45-51 or any combination thereof, further including outputting, by a differential ADC, a digital number indicating the first forward voltage across the first LED or indicating the second forward voltage across the second LED to the processing circuitry.

Example 53. The method of examples 45-52 or any combination thereof, further including causing a first input of a differential ADC to receive a first signal indicating a voltage level at an anode pad of the first pair of pads.

Example 54. The method of examples 45-53 or any combination thereof, further including causing a second input of a differential ADC to receive a second signal indicating a voltage level at a cathode pad of the first pair of pads.

Example 55. The method of examples 45-54 or any combination thereof, further including causing the first input of a differential ADC to receive a third signal indicating a voltage level at an anode pad of the second pair of pads instead of receiving the first signal.

Example 56. The method of examples 45-55 or any combination thereof, further including causing the second input of a differential ADC to receive a fourth signal indicating a voltage level at a cathode pad of the second pair of pads instead of receiving the first signal.

Example 57. The method of examples 45-56 or any combination thereof, further including incrementing a counter in response to determining that the fault exists between the first LED and the second LED.

Example 58. The method of examples 45-57 or any combination thereof, further including outputting a value of the counter to an external device via a diagnostic interface.

Example 59. The method of examples 45-58 or any combination thereof, further including storing, to a memory, a position of the first LED and a position for the second LED in response to determining that the fault exists between the first LED and the second LED.

Example 60. The method of examples 45-59 or any combination thereof, further including outputting the position of the first LED and the position of the second LED to an external device via a diagnostic interface.

Example 61. The method of examples 45-60 or any combination thereof, further including turning on a first subset of the set of LEDs and turning off a second subset of the set of LEDs.

Example 62. The method of examples 45-61 or any combination thereof, wherein the first and second subsets form a chessboard pattern.

Example 63. The method of examples 45-62 or any combination thereof, wherein the first and second subsets form a ring pattern or a striped pattern.

Example 64. The method of examples 45-63 or any combination thereof, further including receiving a signal from an external device via a diagnostic interface.

Example 65. The method of examples 45-64 or any combination thereof, further including determining whether the fault exists between the first LED and the second LED in response to receiving a signal from an external device.

Example 66. The method of examples 45-65 or any combination thereof, further including performing the built-in self-test in response to receiving a signal from an external device.

Example 67. The method of examples 45-66 or any combination thereof, further including determining whether the fault exists between the first LED and the second LED during a startup phase of the device.

Example 68. The method of examples 45-67 or any combination thereof, wherein the first LED is adjacent to the second LED.

Example 69. The method of examples 45-68 or any combination thereof, wherein the first LED arranged diagonal to the second LED in a matrix.

Example 70. The method of examples 45-69 or any combination thereof, wherein determining that the fault exists includes determining that a short circuit exists between a cathode pad of the first pair of pads and a cathode pad of the second pair of pads.

Example 71. The method of examples 45-70 or any combination thereof, further including controlling a connection network to connect an ADC to a terminal of the first LED or a terminal of the second LED one-at-a time.

Example 72. A device includes a built-in self-test for detecting a fault between a first LED and a second LED of a set of LEDs includes a set of pads including a first pair of pads configured to connect to the first LED and a second pair of pads configured to connect to the second LED. The device also includes a set of drivers, wherein each driver of the set of drivers includes a pass device configured to electrically connected to a respective pad of the set of pads, and wherein each driver of the set of drivers is configured to control whether a respective LED of the set of LEDs is turned on or off. The device further includes processing circuitry configured to cause a first driver of a set of drivers to turn on a first respective pass device and cause a second driver of the set of drivers to control a second respective pass device to turn off the second LED. The processing circuitry is further configured to determine a first forward voltage across the first LED, determine a second forward voltage across the second LED, and determine that a fault exists between a first LED and a second LED of the set of LEDs based on the first and second forward voltages.

Example 73. The device of example 72, further including a sense resistor configured to be connected to the first anode pad and to the first cathode pad.

Example 74. The device of example 72 or example 73, further including a differential ADC configured to measure the voltage across a sense resistor.

Example 75. The device of examples 72-74 or any combination thereof, further including a connection network configured to connect to the first anode pad and the first cathode pad.

Example 76. The device of examples 72-75 or any combination thereof, further including a memory configured to store a trimming coefficient for a sense resistor.

Example 77. The device of examples 72-76 or any combination thereof, further including a memory configured to store a minimum value, a maximum value, and a mean value of voltage differences across each LED, each pair of pads, and/or each driver.

Example 78. The device of examples 72-77 or any combination thereof, wherein the processing circuitry includes a state machine configured to cause the set of drivers to turn on and off pass devices one by one as part of a self test.

Example 79. The device of examples 72-78 or any combination thereof, wherein the processing circuitry is configured to perform the method of examples 45-71 or any combination thereof.

Example 80. A device includes a computer-readable medium having executable instructions stored thereon, configured to be executable by processing circuitry for causing the processing circuitry to perform the method of examples 45-71 or any combination thereof.

Example 81. A system includes means for performing the method of examples 45-71 or any combination thereof.

Various examples of the disclosure have been described. Any combination of the described systems, operations, or functions is contemplated. These and other examples are within the scope of the following claims.

What is claimed is:

1. A device including a built-in self-test for detecting a fault between a first light emitting diode (LED) and a second LED of a set of LEDs, the device comprising:
    a set of pads comprising:
        a first pair of pads configured to connect to the first LED;
        a second pair of pads configured to connect to the second LED;
    a set of drivers, wherein each driver of the set of drivers includes a pass device configured to electrically connected to a respective pad of the set of pads, and wherein each driver of the set of drivers is configured to control whether a respective LED of the set of LEDs is turned on or off; and
    processing circuitry configured to:
        cause a first driver to control a first respective pass device to turn on the first LED;
        cause a second driver to control a second respective pass device to turn off the second LED;
        determine a first forward voltage across the first LED;
        determine a second forward voltage across the second LED; and
        determine whether a fault exists between the first LED and the second LED based on the first and second forward voltages.

2. The device of claim 1, wherein the processing circuitry is further configured to:
    determine whether the first forward voltage is outside of a first acceptable range for activated LEDs; and
    determine whether the second forward voltage is outside of a second acceptable range for deactivated LEDs,
    wherein the processing circuitry is configured to determine that the fault exists in response to:
        determining that the first forward voltage is outside of the first acceptable range; or
        determining that the second forward voltage is outside of the second acceptable range.

3. The device of claim 2, wherein the processing circuitry is configured to determine whether the first forward voltage is outside of the first acceptable range by determining that the first forward voltage is less than a first threshold level for activated LEDs.

4. The device of claim 2, wherein the processing circuitry is configured to determine whether the second forward voltage is outside of the second acceptable range by determining that the second forward voltage is greater than a second threshold level for deactivated LEDs.

5. The device of claim 1, further comprising a differential analog-to-digital converter (ADC) configured to:

receive, at a first input of the differential ADC, a first signal indicating a voltage level at an anode pad of the first pair of pads;

receive, at a second input of the differential ADC, a second signal indicating a voltage level at a cathode pad of the first pair of pads LED; and output a digital number indicating the first forward voltage across the first LED to the processing circuitry.

6. The device of claim 5, wherein the processing circuitry is further configured to:

cause the first input of the differential ADC to receive a third signal indicating a voltage level at an anode pad of the second pair of pads instead of receiving the first signal; and cause the second input of the differential ADC to receive a fourth signal indicating a voltage level at a cathode pad of the second pair of pads instead of receiving the second signal.

7. The device of claim 1, wherein the processing circuitry is further configured to increment a counter in response to determining that the fault exists between the first LED and the second LED.

8. The device of claim 7, wherein the processing circuitry is further configured to output a value of the counter to an extremal device via a diagnostic interface.

9. The device of claim 1, further comprising a memory, wherein the processing circuitry is further configured to store, to the memory, a position of the first LED and a position for the second LED in response to determining that the fault exists between the first LED and the second LED.

10. The device of claim 9, wherein the processing circuitry is further configured to output the position of the first LED and the position of the second LED to an external device via a diagnostic interface.

11. The device of claim 1, wherein the processing circuitry is further configured to cause the set of drivers to:

turn on a first subset of the set of LEDs; and turn off a second subset of the set of LEDs, wherein the first and second subsets form a chessboard pattern.

12. The device of claim 1, wherein the processing circuitry is configured to receive a signal from an external device via a diagnostic interface, and wherein the processing circuitry is configured to determine whether the fault exists between the first LED and the second LED in response to receiving the signal from the extremal device.

13. The device of claim 1, wherein the processing circuitry is configured to determine whether the fault exists between the first LED and the second LED during a startup phase of the device.

14. The device of claim 1, wherein the first LED is adjacent to the second LED.

15. The device of claim 1, wherein the processing circuitry is configured to determine that the fault exists by determining that a short circuit exists between a cathode pad of the first pair of pads and a cathode pad of the second pair of pads.

16. A method for a built-in self-test to detect a fault between a first LED and a second LED of a set of LEDs, the method comprising:

causing a first driver of a set of drivers to control a first respective pass device to turn on the first LED, wherein each driver of the set of drivers includes a pass device electrically connected to a respective LED of the set of LEDs, and wherein each driver of the set of drivers is configured to control whether a respective LED of the set of LEDs is turned on or off;

causing a second driver of the set of drivers to control a second respective pass device to turn off the second LED;

determining a first forward voltage across the first LED;

determining a second forward voltage across the second LED; and determining that a fault exists between a first LED and a second LED of the set of LEDs based on the first and second forward voltages.

17. The method of claim 16, wherein the processing circuitry is further configured to:

determine whether the first forward voltage is outside of a first acceptable range for activated LEDs; and determine whether the second forward voltage is outside of a second acceptable range for deactivated LEDs, wherein the processing circuitry is configured to determine that the fault exists in response to:

determining that the first forward voltage is outside of the first acceptable range; or determining that the second forward voltage is outside of the second acceptable range.

18. The method of claim 16, further comprising:

turning on a first subset of the set of LEDs; and turning off a second subset of the set of LEDs, wherein the first and second subsets form a chessboard pattern.

19. A built-in self-test device comprising a computer-readable medium having executable instructions stored thereon, configured to be executable by processing circuitry for causing the processing circuitry to:

cause a first driver of a set of drivers to control a first respective pass device to turn on a first LED of a set of LEDs, wherein each driver of the set of drivers includes a pass device configured to electrically connect to a respective pad of a set of pads LEDs, wherein a first pair of pads is configured to connect to the first LED, and wherein each driver of the set of drivers is configured to control whether a respective LED of the set of LEDs is turned on or off;

cause a second driver of the set of drivers to control a second respective pass device to turn off a second LED of the set of LEDs, wherein a second pair of pads is configured to connect to the second LED;

determine a first forward voltage across the first LED;

determine a second forward voltage across the second LED; and determine that a fault exists between a first LED and a second LED of the set of LEDs based on the first and second forward voltages.

20. The built-in self-test of claim 19, further comprising instructions configured to cause the processing circuitry to:

determine whether the first forward voltage is outside of a first acceptable range for activated LEDs; and determine whether the second forward voltage is outside of a second acceptable range for deactivated LEDs, wherein instructions to determine that the fault exists comprise instructions to determine that the fault exists in response to:

determining that the first forward voltage is outside of the first acceptable range; or determining that the second forward voltage is outside of the second acceptable range.

* * * * *